(12) United States Patent
Akram

(10) Patent No.: US 6,730,543 B2
(45) Date of Patent: May 4, 2004

(54) METHODS FOR MULTIPLE DIE STACK APPARATUS EMPLOYING

(75) Inventor: Salman Akram, Boise, ID (US)

(73) Assignee: Micron Technology, Inc., Boise, ID (US)

(*) Notice: Subject to any disclaimer, the term of this patent is extended or adjusted under 35 U.S.C. 154(b) by 137 days.

(21) Appl. No.: 09/989,341

(22) Filed: Nov. 20, 2001

(65) Prior Publication Data

US 2002/0030263 A1 Mar. 14, 2002

Related U.S. Application Data

(62) Division of application No. 09/247,009, filed on Feb. 8, 1999, now Pat. No. 6,351,028.

(51) Int. Cl.⁷ .......................... H01L 21/48; H01L 21/50; H01L 21/44
(52) U.S. Cl. .......................... 438/109; 438/122; 438/125
(58) Field of Search .............................. 438/109, 122.1, 438/25, FOR 369

(56) References Cited

U.S. PATENT DOCUMENTS

| | | | |
|---|---|---|---|
| 5,434,745 A | 7/1995 | Shokrgozar et al. |
| 5,515,241 A | 5/1996 | Werther |
| 5,569,956 A | 10/1996 | Chillara et al. |
| 5,585,675 A | 12/1996 | Knopf |
| 5,904,497 A | 5/1999 | Akram |
| 6,005,778 A | 12/1999 | Spielberger et al. |
| 6,028,365 A | 2/2000 | Akram et al. |

FOREIGN PATENT DOCUMENTS

JP  63-128736  6/1988

*Primary Examiner*—David E. Graybill
(74) *Attorney, Agent, or Firm*—TraskBritt

(57) ABSTRACT

Multiple integrated circuit devices in a stacked configuration that uses a spacing element for allowing increased device density and increased thermal conduction or heat removal for semiconductor devices and the methods for the stacking thereof are disclosed.

16 Claims, 5 Drawing Sheets

METHODS FOR MULTIPLE DIE STACK APPARATUS EMPLOYING

CROSS-REFERENCE TO RELATED APPLICATION

This application is a divisional of application Ser. No. 09/247,009, filed Feb. 8, 1999, now U.S. Pat. No. 6,351,028, issued Feb. 26, 2002.

BACKGROUND OF THE INVENTION

1. Field of the Invention

The present invention relates generally to the packaging of integrated circuit devices by interposing a plurality of integrated circuit devices within a common package for increased semiconductor device density. More particularly, the present invention relates to multiple integrated circuit devices in a stacked configuration that uses a spacing element allowing increased semiconductor device density and allowing better thermal conductivity for dissipating heat for semiconductor memory devices, semiconductor processor type devices, or any desired type integrated circuit semiconductor device.

2. State of the Art

Integrated circuit semiconductor devices have been known since shortly after the development of the electronic transistor device. The goals in designing and manufacturing semiconductor devices have been to make the devices smaller, more complex, with higher densities, and to include additional features. One method that improves the features and the densities of the semiconductor devices is to shrink the line sizes used in the lithographic process step in fabricating semiconductor devices. For example, each one-half reduction in line width of the circuits of the semiconductor device corresponds to a four-fold increase in chip density for the same size device. Unfortunately, increasing density simply through improved lithographic techniques is limited because of physical limits and the cost factor of scaling down the dimensions of the semiconductor device. Accordingly, alternative solutions to increase semiconductor device density have been pursued. One such alternative has been the stacking of multiple semiconductor devices. However, conventional stacking of semiconductor devices can lead to excessive local heating of the stacked semiconductor devices as well as lead to restraints on how the heat may be removed from the stacked semiconductor devices.

One approach of semiconductor device (die) stacking uses a chip geometry known as cubic chip design and is illustrated in drawing FIG. 1 (Prior Art). The device 2 includes substrate 4, upon which a plurality of semiconductor devices 6 is stacked. Each semiconductor device 6 is connected to another semiconductor device and to substrate 4 via bonding elements 8, which are then encased in a suitable type of resin material 10 forming a package. The semiconductor devices 6 are designed such that an overhanging flange is provided by cutting the edges of a semiconductor device at approximately a 30 to 35-degree angle and inverting the device for the bonding connection. This allows the semiconductor devices 6 to stack one on top of another in a uniform and tight arrangement.

Unfortunately, the cubic design has several disadvantages that make it unsuitable for all types of semiconductor device packaging design. One disadvantage is that the cubic stacking of the semiconductor devices one on top of another causes stack stresses or bending, or both. Additionally, because of stack stressing or bending, there is a limit to the number of semiconductor devices that can be stacked one on top of another. Also, if the adhesive of the stack weakens and comes loose, the semiconductor device will shift, which can result in the breaking of the bonds between the various devices 6 and the substrate 4. Furthermore, the stacking of the semiconductor devices generates thermal and mechanical problems where the semiconductor devices generate heat that cannot be easily dissipated when they are stacked one upon another.

Additional solutions have been developed in the prior art and are illustrated in U.S. Pat. No. 5,585,675 ('675 patent) and U.S. Pat. No. 5,434,745 ('745 patent). The '675 patent discloses a packaging assembly for a plurality of semiconductor devices that provides for stacking of the semiconductor devices. The packaging assembly uses angularly offset pad-to-pad via structures that are configured to allow three-dimensional stacking of the semiconductor devices. The electrical connection is provided to a via structure where multiple identical tubes are provided in which a semiconductor device is mounted and then one tube is mounted on top of another tube. The angularly offset via pads are provided through the stack tube structure for connection. One disadvantage with the angularly offset pad via structure is that the tubes must be precisely manufactured so that the vias are lined up properly. Further, the semiconductor devices must be set within strict tolerances for the tubes to stack one on top of another so the vias can be aligned properly as well.

The '745 patent discloses a stacked semiconductor device carrier assembly and a method for packaging interconnecting semiconductor devices. The carriers are constructed from a metal substrate onto which the semiconductor device attaches. Next, the semiconductor device is wired bonded to the conductor pattern on the substrate and each conductor is routed to the edge of the substrate where it is connected to a half circle of metallized through-hole. Again, the '745 patent discloses a tube-like design with half circle vias for allowing interconnection to the stack of multiple semiconductor devices.

One disadvantage with the stack type semiconductor device carrier of the '745 patent is that the tubes are connected one with another. Any potential rework operation involving the wire connections is very difficult in that the tube assemblies must be disassembled for such a rework operation.

Accordingly, a multiple stacked arrangement of semiconductor devices and associated methods of stacking that reduce stack stresses or bending of the semiconductor devices, that allow easier reworking of the wiring interconnecting bond pads of the semiconductor devices, that protect the bond pads of each semiconductor device from the other devices, and that effectively remove heat from the semiconductor devices are needed.

SUMMARY OF THE INVENTION

The present invention is directed to the packaging of integrated circuit devices by interposing a plurality of integrated circuit devices within a common package for increased semiconductor device density. The present invention relates to multiple integrated circuit devices in a stacked configuration that uses a spacing element for allowing increased device density and the removal of thermal energy from semiconductor devices and the methods for the stacking thereof.

DETAILED DESCRIPTION OF THE ILLUSTRATED EMBODIMENT

Figure 2:
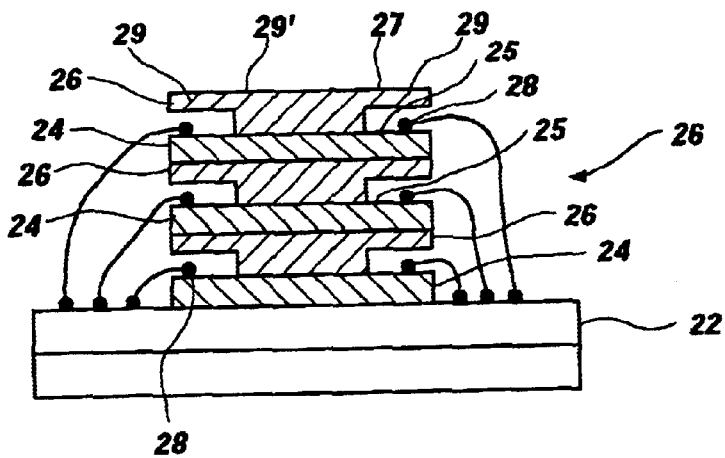
FIG. 2 is a cross-sectional diagram of an embodiment of the T-interposer devices of the present invention used for the stacking of multiple semiconductor devices according to the present invention.

Illustrated in a cross-sectional diagram in drawing FIG. 2 is a multi-stacked semiconductor device structure utilizing a T-interposer device having a T-shape in cross-section of the present invention. Multiple stack unit 20 comprises a substrate 22, a first semiconductor device 24 disposed on substrate 22, a first T-interposer 26 disposed on the first semiconductor device 24, and multiple semiconductor devices 24 disposed on multiple T-interposers 26. Each semiconductor device 24 includes a plurality of bond pads 28 thereon. Each T-interposer 26 includes a substantially vertical stem 27 having substantially vertical edges and T-bar cross portions or members 29 having substantially horizontal edges or surfaces with respect to the vertical edges of the stem 27, the upper surface 29' of the T-bar members 29 extending across the stem 27 to form a substantially horizontal surface with respect to the vertical upon which to mount one or more semiconductor devices 24. The flange (horizontal) edges or surfaces of each T-interposer 26 are offset so that a portion of the active surface 25 of each semiconductor device 24 attaches to the base of the stem 27 of an adjacent T-interposer 26 while bond pads 28 of each semiconductor device 24 are exposed for wire bonding to substrate 22 or another semiconductor device 24 or the circuit of another T-interposer 26. Each semiconductor device 24 is subsequently stacked one on top of another in a horizontal plane with a T-interposer 26 disposed between each semiconductor device 24. Each semiconductor device 24 may be bonded either to the T-interposer 26, another semiconductor device 24, or to substrate 22 or both. In this structure, the T-interposer 26 is placed on an individual semiconductor device 24 as other semiconductor devices 24 are stacked one on top of another, each stacked device 24 being located in a separate substantially horizontal plane. This provides for access and protection to bond pads 28 of the semiconductor devices 24. The T-interposer 26 can be made of a variety of materials, including those materials having a coefficient of thermal expansion (CTE) matching or similar to the semiconductor device(s) 24, such as silicon, ceramic, alloy 42, etc. and having the desired thermal energy (heat transfer or conductivity) characteristics for the transfer of thermal energy or heat from semiconductor devices in contact with or around T-interposer 26. Alternately, the material for the T-interposer 26 may be selected for thermal energy insulation effects to prevent thermal energy from being transferred from one semiconductor device 24 connected to the T-interposer to another semiconductor device 24 connected to the T-interposer.

Figure 1:
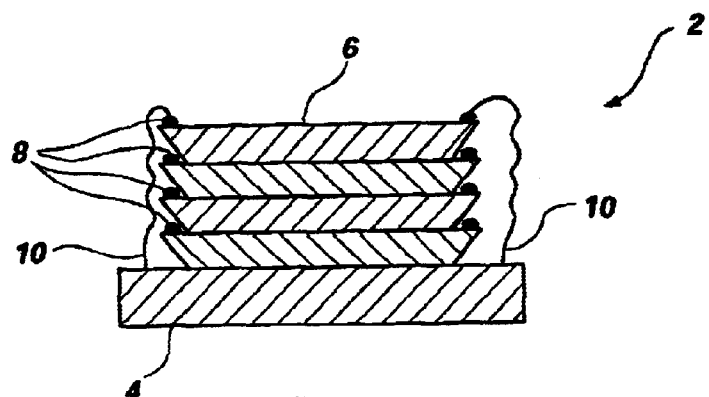
FIG. 1 is a cross-sectional view of a prior art cubic semiconductor device package.

This protects the semiconductor devices 24 during the stacking and enables a variety of interconnections to be used between semiconductor devices 24, T-interposers 26, and/or substrates 22. The interconnection between semiconductor devices 24 or T-interposers 26 or substrates 22, or both, uses conductor traces, tape, wire bonding, conductive paste, or conductive adhesives, or any other type of suitable semiconductor interconnection technique known to one skilled in the art. The T-interposer 26 allows bond pads 28 of the semiconductor device 24 to be exposed, so no additional rerouting steps are required to reroute a bond pad 28 to the edges. This is advantageous over the prior art structures, such as the cubic design shown in drawing FIG. 1, in that the shell case or the interconnection requires additional processing in those materials and additional time. Further, the flanged edges forming the stem 27 of T-interposer 26 allow direct connection to the bond pads 28 and contact to all four sides of semiconductor devices 24. This allows increased interconnect density between a substrate and a plurality of semiconductor devices.

In multiple stack unit 20, if desired, the first semiconductor device 24, which is mounted to substrate 22, can be a microprocessor while the second semiconductor device 24, located above T-interposer 26 mounted to the first semiconductor device 24 located on the substrate 22, can be a semiconductor memory device, which allows for mixing and matching of the semiconductor devices such as memory devices and processing devices and control logic devices for a complete, integrated semiconductor device package.

Figure 3:
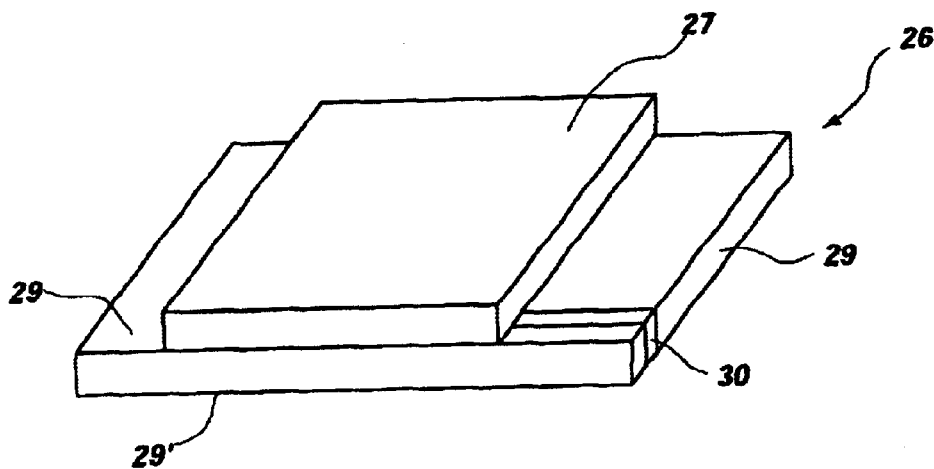
FIG. 3 is a perspective view of an embodiment of a single T-interposer of the present invention.

Referring to drawing FIG. 3, further illustrated is an inverted T-interposer 26 as shown in drawing FIG. 2. Again, T-interposer 26 can be manufactured to match the same CTE of the semiconductor device 24 or the semiconductor device substrate 22 used for each of semiconductor devices 24, or both. This allows T-interposer 26 to serve as a thermal or heat dissipation device between each semiconductor device 24 while allowing for greater heat dissipation than would otherwise be possible were the semiconductor devices 24 stacked directly upon each other. Further, T-interposer 26 provides electrical insulation between each semiconductor device 24 that would not be otherwise possible were the semiconductor devices to be stacked one upon another such as in the prior art described in drawing FIG. 1. Additionally, the T-interposer 26 may be comprised of two different materials to provide both thermal conductivity from one semiconductor device and thermal insulation with respect to a second semiconductor device. For instance, the stem 27 may be of a thermally conductive material while the T-bar members 29 are formed of a thermally insulative material, the stem 27 may be joined to the T-bar member(s) 29 by any suitable means, such as adhesive bonding, etc. The T-interposer 26 of the present invention provides for much greater bonding edge relief for different types of connection devices with respect to the bond pad location on the active surface of the semiconductor device 24 than that shown in the prior art device illustrated in drawing FIG. 1 and greater insulation capacity for the bond pads 28 of the semiconductor devices 24 with the T-interposer 26 in place. Finally, a top T-interposer 26 is further provided for capping the device to protect and promote heat transfer from the last semiconductor device 24 forming the multiple stacked unit 20.

Still referring to the T-interposer 26 illustrated in drawing FIG. 3, an electrical bonding interconnect element 30 is manufactured into T-interposer 26 to provide subsequent connection should the bond pads 28 on active surface 25 of the semiconductor device 24 be mounted or connected to the T-shaped interposer 26 for electrical interconnection.

Figure 4:
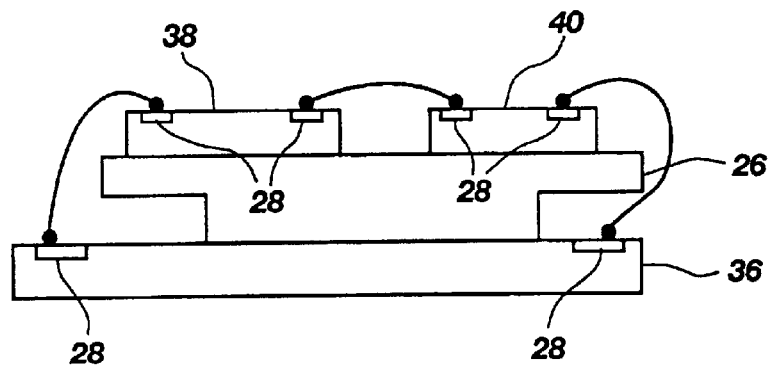
FIG. 4 is a cross-sectional view of multiple semiconductor devices mounted to an embodiment of a T-interposer according to the present invention.

Referring to drawing FIG. 4, illustrated is a cross-section diagram of multiple semiconductor devices 38 and 40 being mounted to a single T-interposer 26. T-interposer 26 is mounted to a substrate 36. Substrate 36 includes bond pads/circuits 28 thereon. Semiconductor device 38 can be a processor type semiconductor device while semiconductor device 40 can be a memory type semiconductor device. Semiconductor device 38 and semiconductor device 40 are interconnected via bond pads 28 and further connected to pads or circuits 28 on substrate 36. Additionally, the bonding wire from one pad or circuit 28, such as on device 40, can connect directly to the device structure to which the substrate 36 is to be permanently mounted. This can be the actual circuit board, such as a mother board used in a computer system. Of course, other direct connection options will be readily apparent to one skilled in the art.

Figure 5:
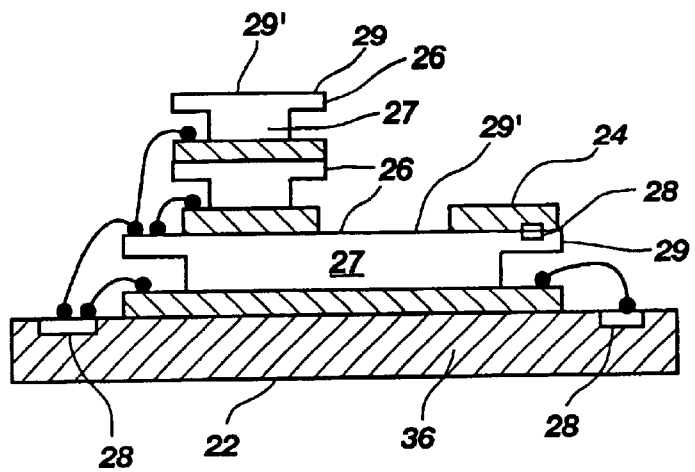
FIG. 5 is a cross-sectional diagram of another embodiment of T-interposers having differing dimensions of the present invention.

Referring to drawing FIG. 5, illustrated is a cross-sectional diagram of an arrangement of multiple semiconductor devices 24 similar to that illustrated in drawing FIG. 4. The present invention illustrated in drawing FIG. 5 further adds multiple stacking upon a particular semiconductor device 24. Multiple T-interposers 26 are provided and are of similar sizes. Additionally, semiconductor device 24 can be directly connected to T-interposer 26 below bond pad 28 thereon. In this manner, substrate 36 mounts directly to mother board substrate 22 where additional bonding pads are provided in substrates 22 and 36.

Figure 6:
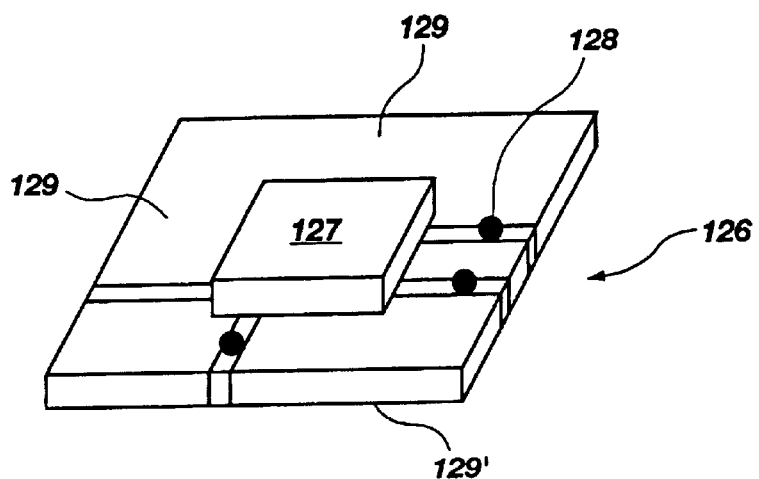
FIG. 6 is a perspective view of an embodiment of an inverted T-interposer of the present invention.

Referring to drawing FIG. 6, depicted is an alternative embodiment T-interposer 126 of the present invention, which is similar to the embodiment of the T-interposer 26 illustrated in drawing FIG. 3. As illustrated in drawing FIG. 6, the T-interposer 126 includes additional recessed sections all around. The entire recessed periphery allows semiconductor devices that have connection pads around the entire perimeter of the device to be exposed for connection. In this manner, greater inter-connectivity is achieved with the ability to connect very dense interconnected circuit devices to other semiconductor devices. Additionally, ball weld spots 128 are provided as well and allow direct electrical and mechanical connection of any subsequent semiconductor devices. The stem 127 of the T-interposer 126 includes T-bar members 129 therearound and substantially horizontal surface 129' located thereabove as described hereinbefore with respect to T-interposer 26.

Figure 7:
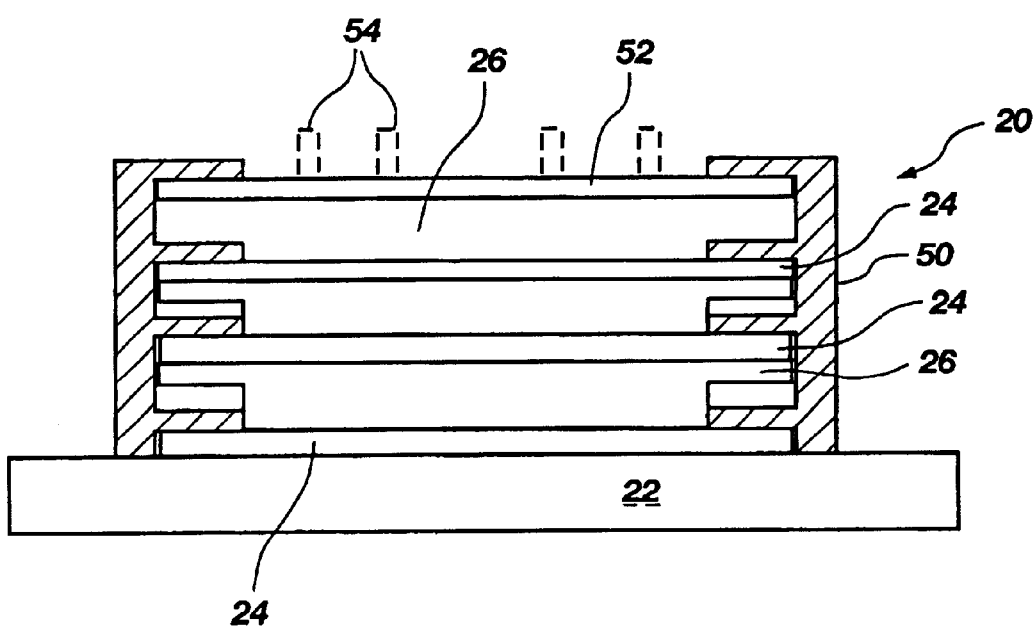
FIG. 7 is a cross-sectional view of a multiple semiconductor devices (die) package that has a sealant about the interconnections.

Referring to drawing FIG. 7, illustrated is a cross-sectional view of a multiple stack unit 20 that is completely sealed or packaged. Again, a substrate 22 is provided upon which a first semiconductor device 24 is mounted with a T-interposer 26 mounted to the first semiconductor device 24. A final cap or top T-interposer 26 is further provided on top of the entire stack unit 20. Lastly, an epoxy interconnect 50 is provided for sealing and/or packaging and electrically isolating the bonding performed between the multiple semiconductor devices 24. If desired, the top of the unit 20 may include a heat sink 52 of suitable type material which may include one or more fins 54 (shown in dashed lines) for additional thermal control of the heat from the unit 20.

Figure 8:
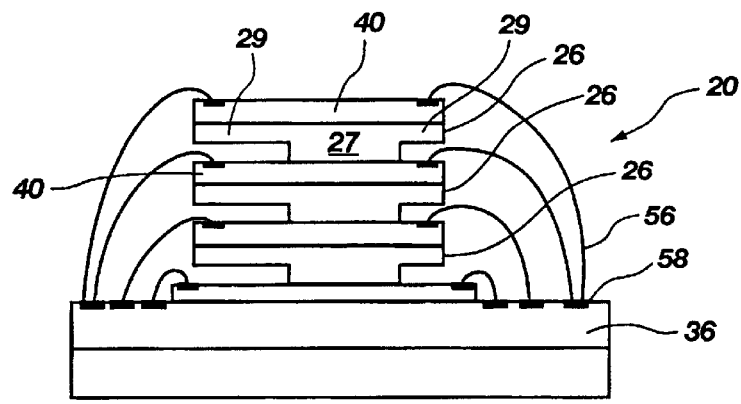
FIG. 8 is a cross-sectional view of another embodiment of the T-interposer of the present invention in a stacked configuration.

Referring to drawing FIG. 8, illustrated is another embodiment of the T-interposer 26 of the present invention in a stacked arrangement between semiconductor devices 40 which are electrically connected by wires 56 to circuits 58 of the substrate 36. In this embodiment of the T-interposer 26 of the present invention, one T-bar member 29 has a greater length or extends farther than the opposing T-bar member 29 of the T-interposer 26 to provide greater bonding edge relief for different types of connection devices with respect to the bond pad location on the active surface of the semiconductor device 24 than the bonding edge relief provided by the T-bar member 29 on the other side of the T-interposer 26. In this manner, the T-interposer 26 is not centrally located on a portion of the active surface of the semiconductor device 40 but, rather, is located off-center on a portion of the active surface of the semiconductor device 40. Such a T-interposer 26 allows for the accommodation of differing sizes and shapes of semiconductor devices 40 and bond pad arrangements thereon for interconnection to the circuits 58 of substrate 36.

Figure 9:
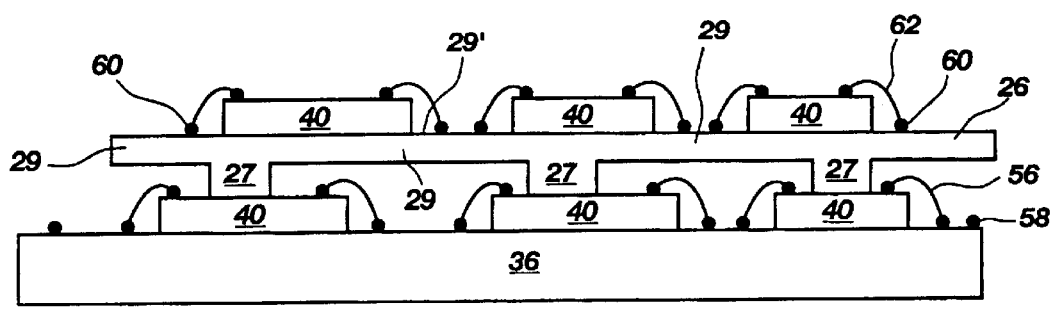
FIG. 9 is a cross-sectional view of another embodiment of the T-interposer of the present invention in a stacked configuration.

Referring to drawing FIG. 9, illustrated is another embodiment of the T-interposer 26 of the present invention where the T-interposer 26 includes a plurality of stems 27 and T-bar members 29 to form the same, each stem 27 located on a portion of the active surface of a semiconductor device 40 which is, in turn, located on a substrate 36 having circuits 58 located thereon connected by wires 56 while wires 62 electrically connect the semiconductor devices 40 located on surface 29' of the T-interposer 26 to the circuits 60 located thereon. In this manner, the T-interposer 26 helps to increase the density of the semiconductor devices 40 located on the substrate 36 while providing thermal control of the heat generated from the semiconductor devices 40 located on the substrate 36 and on the surface 29' of the T-interposer 26.

Each T-interposer 26 can be manufactured in various manners; ideally, the T-interposer 26 consists of a unitary element that is milled or machined from a single piece. The side edges for producing the "T" effect are milled away to preserve the integral strength of the unitary piece. This design prevents fractures occurring in seams of the T-interposer where the top "T" portion is epoxied to the bottom as a separate element. If desired, T-interposer 26 can be made from separate pieces, one having a smaller width than the other, if the epoxy or adhesive used to connect the two elements is of sufficient strength to prevent fracturing or separation, or the strain and load placed on the seams were greatly reduced so as to minimize the possibility of fracturing.

The use of the T-interposer 26 for stacking bare dies has several advantages over prior art solutions. One advantage is that it reduces stack stresses or bending. Further, the T-interposer allows easier reworking of any bond interconnect when necessary. Additionally, as there is no stress problems inherit in stacking semiconductor devices upon other devices as any number of devices can be stacked with T-interposer 26 used in separating device from device, thus allowing for greater device densities for memory devices and other type semiconductor devices. Also, several types of interconnect methods are possible with the T-interposer, such as wire bonding, ball bonding, flip chip bonding, etc. Additional advantages include the bond pads of each semiconductor device being protected from one another in the device stack. Thermal and mechanical properties are improved because of the use of the T-interposer. The improved thermal and mechanical properties also allow for increased semiconductor device density for memory chips and SIMM type devices.

Those skilled in the art will appreciate that semiconductor devices according to the present invention may comprise an integrated circuit die employed for storing or processing digital information, including, for example, a Dynamic Random Access Memory (DRAM) integrated circuit die, a Static Random Access Memory (SRAM) integrated circuit die, a Synchronous Graphics Random Access Memory (SGRAM) integrated circuit die, a Programmable Read-Only Memory (PROM) integrated circuit die, an Electrically Erasable PROM (EEPROM) integrated circuit die, a flash memory die and a microprocessor die, and that the present invention includes such devices within its scope. In addition, it will be understood that the shape, size, and configuration of bond pads, jumper pads, dice, and lead frames may be varied without departing from the scope of the invention and appended claims. For example, the jumper pads may be round, oblong, hemispherical or variously shaped and sized so long as the jumper pads provide enough surface area to accept attachment of one or more wire bonds thereto. In addition, the bond pads may be positioned at any location on the active surface of the die.

Figure 10:
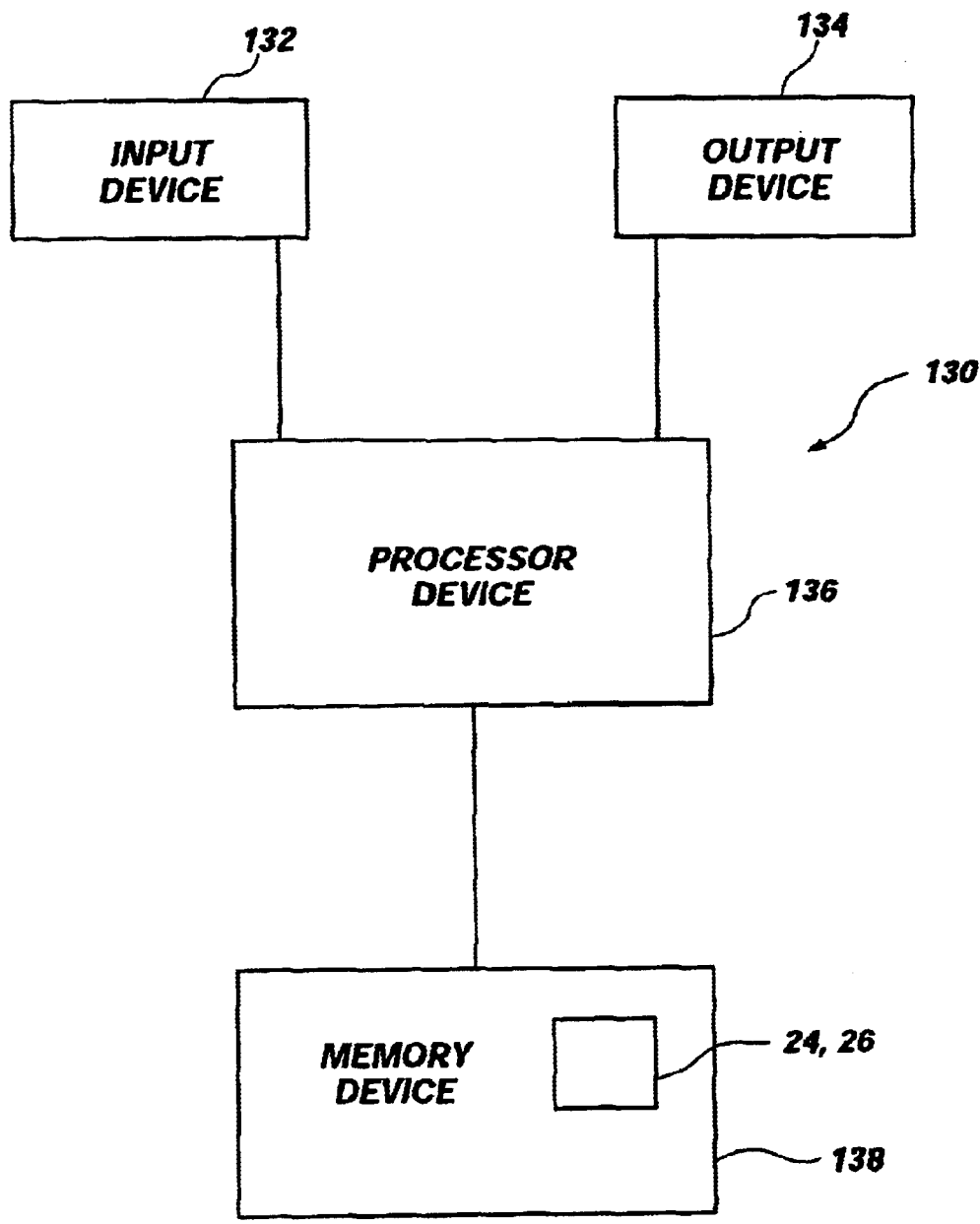
FIG. 10 is a block diagram of an electronic system incorporating the semiconductor device of FIG. 2 and the present invention.

As shown in drawing FIG. 10, an electronic system 130 includes an input device 132 and an output device 134 coupled to a processor device 136 which, in turn, is coupled to a memory device 138 incorporating the exemplary semiconductor device 24 and T-interposer 26 of drawing FIG. 2.

Accordingly, the claims appended hereto are written to encompass all semiconductor devices including those mentioned. Those skilled in the art will also appreciate that various combinations and obvious modifications of the preferred embodiments may be made without departing from the spirit of this invention and the scope of the accompanying claims.

I claim:

1. A method of forming a multiple semiconductor device stack apparatus comprising:
   providing a substrate;
   providing a first semiconductor device having at least one bond pad on an active surface thereof;
   mounting and electrically connecting said first semiconductor device to said substrate;
   providing a first interposer device;
   mounting said first interposer device to said first semiconductor device, on a side opposite said substrate, said first interposer device having a first surface of a first area and a second surface of a second area less than said first area with a first pair of recesses formed on opposing edges of said first interposer device thus exposing said at least one bond pad on said active surface of said first semiconductor device, said second surface mounted to said active surface of said first semiconductor device;
   providing a second semiconductor device; and
   mounting said second semiconductor device on said first surface of said first interposer device, opposite said first semiconductor device and electrically connecting said second semiconductor device to either said first semiconductor device or to said substrate or both.

2. The method of forming a multiple semiconductor device stack apparatus according to claim 1, further comprising:
   providing a second interposer device having a first side and a second side; and
   mounting said second interposer device to said second semiconductor device on said first side, wherein said second interposer device includes a bond pad recess opening for allowing connection between either said first and second semiconductor devices or between said first and second semiconductor devices and said substrate or both.

3. A method of forming a multiple semiconductor device stack apparatus comprising;
   providing a substrate;
   providing a first semiconductor device having at least one bond pad on an active surface thereof;
   mounting and electrically connecting said first semiconductor device to said substrate;
   providing a first thermally conductive interposer device;
   mounting said first thermally conductive interposer device to said first semiconductor device, on a side opposite said substrate, said first thermally conductive interposer device having a first surface of a first area and a second surface of a second area less than said first area with a first pair of recesses formed on opposing edges of said first thermally conductive interposer device thus exposing said at least one bond pad on said active surface of said first semiconductor device, said second surface mounted to said active surface of said first semiconductor device;
   providing a second semiconductor device; and
   mounting said second semiconductor device on said first surface of said first thermally conductive interposer device, opposite said first semiconductor device and electrically connecting said second semiconductor device to either said first semiconductor device or to said substrate or both.

4. The method of claim 3, further comprising:
   providing a second interposer device having a first side and a second side; and
   mounting said second interposer device to said second semiconductor device on said first side thereof, wherein said second interposer device includes a bond pad recess opening for allowing connection between either said first and second semiconductor devices or between said first and second semiconductor devices and said substrate or both.

5. The method of claim 4, wherein said second interposer device comprises a thermally conductive interposer.

6. The method of claim 4, wherein said second interposer device comprises a thermally insulative interposer.

7. The method of claim 4, wherein said second interposer device comprises a thermally conductive and thermally insulative interposer.

8. The method of claim 3, wherein said first thermally conductive interposer device includes a thermally insulative portion.

9. (Amended) A method for forming a stack of multiple semiconductor devices comprising:
   providing a substrate;
   providing a first semiconductor device having at least one bond pad on an active surface thereof;
   mounting and electrically connecting said first semiconductor device to said substrate;
   providing a first interposer device;

mounting said first interposer device to said first semiconductor device, on a side opposite said substrate, said first interposer device having a first surface of a first area and a second surface of second area less than said first area with a first pair of recesses formed on opposing edges of said first interposer device thus exposing said at least one bond pad on said active surface of said first semiconductor device, said second surface mounted to said active surface of said first semiconductor device;

providing a second semiconductor device; and mounting said second semiconductor device on said first surface of said first interposer device, opposite said first semiconductor device and electrically connecting said second semiconductor device to either said first semiconductor device or to said substrate or both.

10. The method of claim 9, further comprising:

providing a second interposer device having a first side and a second side; and mounting said second interposer device to said second semiconductor device on said first side, wherein said second interposer device includes a bond pad recess opening for allowing connection between either said first and second semiconductor devices or between said first and second semiconductor devices and said substrate or both.

11. A method of forming a stack of semiconductor devices comprising:

providing a substrate;

providing a first semiconductor device having at least one bond pad on an active surface thereof; mounting and electrically connecting said first semiconductor device to said substrate;

providing a first thermally conductive interposer device;

mounting said first thermally conductive interposer device to said first semiconductor device, on a side opposite said substrate, said first thermally conductive interposer device having a first surface of a first area and a second surface of a second area less than said first area with a first pair of recesses formed on opposing edges of said first thermally conductive interposer device thus exposing said at least one bond pad on said active surface of said first semiconductor device, said second surface mounted to said active surface of said first semiconductor device;

providing a second semiconductor device; and mounting said second semiconductor device on said first surface of said first thermally conductive interposer device, opposite said first semiconductor device and electrically connecting said second semiconductor device to either said first semiconductor device or to said substrate or both.

12. The method of claim 11, further comprising:

providing a second interposer device having a first side and a second side; and mounting said second interposer device to said second semiconductor device on said first side thereof, wherein said second interposer device includes a bond pad recess opening for allowing connection between either said first and second semiconductor devices or between said first and second semiconductor devices and said substrate or both.

13. The method of claim 12, wherein said second interposer device comprises a thermally conductive interposer.

14. The method of claim 12, wherein said second interposer device comprises a thermally insulative interposer.

15. The method of claim 12, wherein said second interposer device comprises a thermally conductive and thermally insulative interposer.

16. The method of claim 11, wherein said first thermally conductive interposer device includes a thermally insulative portion.

\* \* \* \* \*

UNITED STATES PATENT AND TRADEMARK OFFICE
CERTIFICATE OF CORRECTION

PATENT NO. : 6,730,543 B2  
APPLICATION NO. : 09/989341  
DATED : May 4, 2004  
INVENTOR(S) : Salman Akram It is certified that error appears in the above-identified patent and that said Letters Patent is hereby corrected as shown below:

On the title page:

In ITEM (54) "Title,"  change "METHODS FOR MULTIPLE DIE STACK APPARATUS EMPLOYING" to --METHODS FOR MULTIPLE DIE STACK APPARATUS EMPLOYING T-SHAPED INTERPOSER ELEMENTS--

In ITEM (57) "Abstract," 2nd line,  change "uses" to --use--

In FIG. 2,  change the occurrence of reference numeral "26" on the far right-hand side that is pointing to the multiple stack structure to --20-- replace as shown below

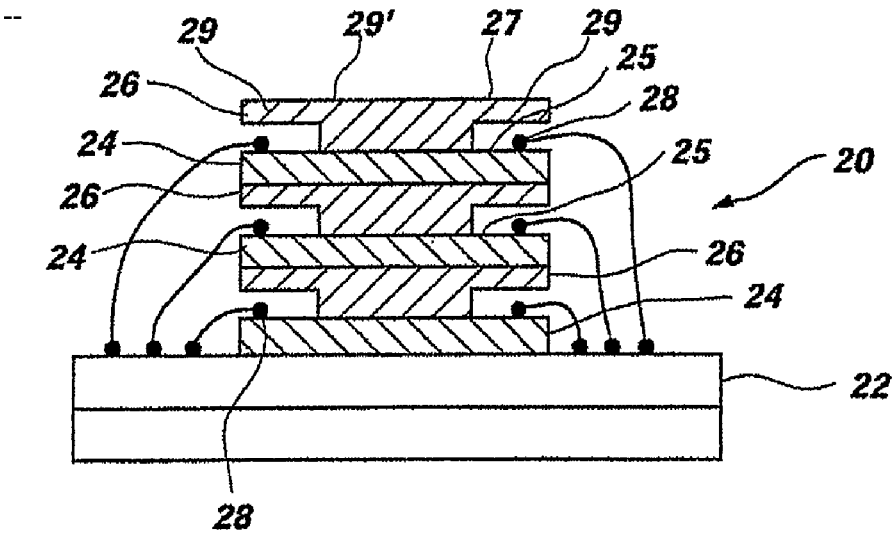

Fig. 2

UNITED STATES PATENT AND TRADEMARK OFFICE
CERTIFICATE OF CORRECTION

PATENT NO. : 6,730,543 B2
APPLICATION NO. : 09/989341
DATED : May 4, 2004
INVENTOR(S) : Salman Akram Page 2 of 2

It is certified that error appears in the above-identified patent and that said Letters Patent is hereby corrected as shown below:

|  | COLUMN 1, | LINE 2, | after "EMPLOYING" insert --T-SHAPED INTERPOSER ELEMENTS-- |
|---|---|---|---|
|  | COLUMN 2, | LINE 35, | change "of metallized" to --of a metallized-- |
|  | COLUMN 3, | LINE 17, | change "devices (die)" to --device (die)-- |
|  | COLUMN 4, | LINE 3, | change "alloy 42," to --alloy 42,-- |
|  | COLUMN 7, | LINE 38, | change "I claim:" to --What is claimed is:-- |
| CLAIM 1, | COLUMN 7, | LINES 40-41, | delete the space between "stack" and "apparatus" to form one line |
| CLAIM 3, | COLUMN 8, | LINES 11-12, | delete the space between "stack" and "apparatus" to form one line |
| CLAIM 9, | COLUMN 8, | LINE 59, | delete "(Amended)" |

Signed and Sealed this

Twenty-fifth Day of December, 2007

JON W. DUDAS
*Director of the United States Patent and Trademark Office*